United States Patent [19]

Panosh

[11] Patent Number: 4,994,746
[45] Date of Patent: Feb. 19, 1991

[54] METHOD OF AND APPARATUS FOR NUCLEAR MAGNETIC RESONANCE ANALYSIS USING TRUE LOGARITHMIC AMPLIFIER

[75] Inventor: Richard L. Panosh, Lisle, Ill.

[73] Assignee: Advanced Techtronics, Inc., Downers Grove, Ill.

[21] Appl. No.: 403,089

[22] Filed: Sep. 5, 1989

[51] Int. Cl.$^5$ .............................................. G01R 33/20
[52] U.S. Cl. ..................................... 324/322; 324/307
[58] Field of Search ............... 324/300, 307, 309, 310, 324/311, 312, 313, 314, 318, 322

[56] References Cited

U.S. PATENT DOCUMENTS 4,950,991 8/1990 Zur ........................................ 324/307

Primary Examiner—Michael J. Tokar
Attorney, Agent, or Firm—Jones, Day, Reavis & Pogue

[57] ABSTRACT

A true logarithmic amplifier is used in combination with an apparatus for transmitting and receiving signals produced during nuclear magnetic resonance analysis. The true logarithmic amplifier is used to compress the dynamic range of signals produced by the reorientation of excited magnetic dipoles such as those of protons as they return to an aligned, unexcited state, with the compression of the dynamic range avoiding saturation of the amplifier by strong signals and preserving all phase information and hence sideband components of the received signals for processing and analysis.

16 Claims, 8 Drawing Sheets

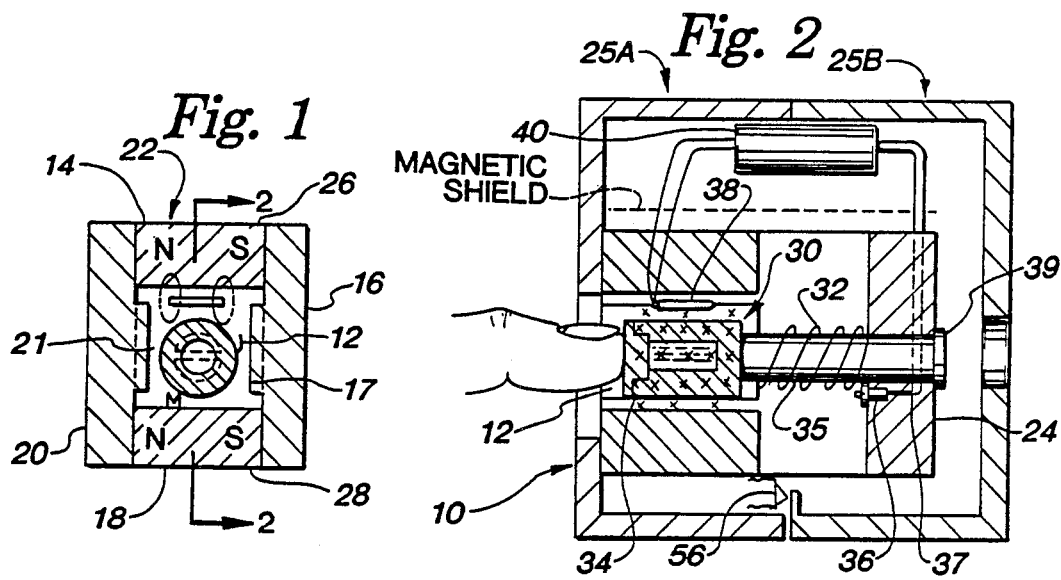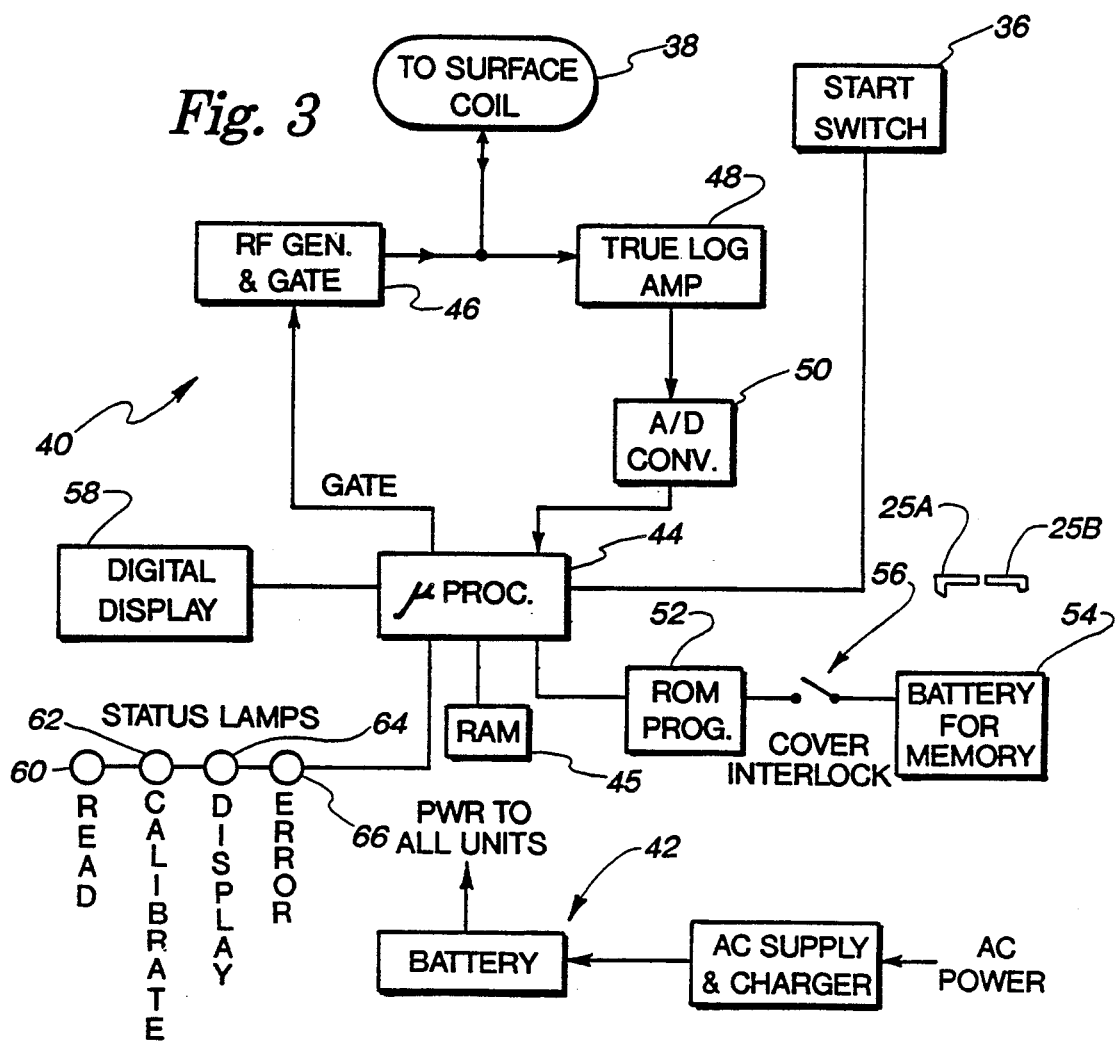

METHOD OF AND APPARATUS FOR NUCLEAR MAGNETIC RESONANCE ANALYSIS USING TRUE LOGARITHMIC AMPLIFIER

BACKGROUND OF THE INVENTION

This invention relates generally to improvements in nuclear magnetic resonance analysis and specifically to the use of a true logarithmic amplifier to compress the dynamic range of a composite signal from a nuclear magnetic resonance receiver.

The development of nuclear magnetic resonance (NMR) spectroscopy for biological diagnostics was a discovery welcomed by biochemists who analyze living systems. An extensive discussion of this technique and its application to living systems may be found in copending applications Serial Nos. 904,000, filed Sept. 4, 1986, and 106,114, filed Oct. 7, 1987, both assigned to the assignee of the present invention, which are incorporated here by reference as if set forth fully.

It is well known that techniques for NMR spectroscopy rely upon identifying characteristic concentrations and distributions of protons in a test sample, which may be in vivo as well as in vitro, by subjecting the sample to pulses of electromagnetic energy while the sample is positioned within a uniform magnetic field. A typical such pulse used to analyze protons is at 50 MHz for 10 microseconds, although frequencies and pulse widths will vary. The embodiments of the invention described here are aimed at biological analysis, in which protons are of special interest. It should be emphasized, however, that organic constituents are only a part of the subject matter of NMR.

Data characteristic of the proton population received while the sample is under the influence of the magnetic field yield valuable information about living systems without the use of invasive examination techniques and methods. Where the sample is a live person or animal, many constituents are present in various concentrations, including a large concentration of water. The detection of millimolar or comparably small concentrations of a constituent in water can be very difficult.

One area in which this difficulty becomes significant is the detection of glucose levels in the bloodstream of a diabetic patient. The usual treatment for diabetes is single or multiple insulin injections daily. To determine if insulin is needed, blood is withdrawn from a patient and is tested for its glucose concentration, typically by a litmus indicator. If it is indicated, insulin is taken by the patient. This type of periodic testing can result in wide variations in detected glucose concentration over time, and treatment based upon this testing can create periods of high and low glucose concentration. Such variations can have physiological effects which may be adverse to the patient.

It is desirable to administer insulin periodically on demand and in response to changes in glucose levels. Such a technique is disclosed in A. Albisser, "Devices for the Control of Diabetes Mellitus", Proc. IEEE 67 No. 9, 1308–1310 (1979), in which a servo-controlled system continuously or continually withdraws blood from a patient. The blood sample is analyzed using a computer or microprocessor, the need for insulin is determined, and insulin is administered in response to that need. The main disadvantage of this system is that it is invasive, requiring the patient to be catheterized or the like to allow withdrawal of blood samples. The litmus test is similarly invasive, requiring the patient to be pricked repeatedly for blood samples.

In testing using techniques of NMR spectroscopy to determine the presence and concentration of glucose in the bloodstream of diabetic humans, the measurement of normal glucose levels produces a signal having a dynamic range of 37dB or more. This range is necessary because of the small concentration of glucose in body fluids. Such a dynamic range makes it difficult to identify the concentration of glucose accurately by linear receivers of the type conventionally used to detect nuclear magnetic resonance. Conventional linear receivers will tend to saturate and process the signal in such a way as to cause nonlinear mixing which results in intermodulation or other distortion of the processed output signal. Digitizing this distorted analog signal in a conventional analog-to-digital converter to produce an accurate reading is extremely difficult. Small processed signals are very difficult to digitize in the presence of an adjacent stronger processed signal. The resulting digitized signal that is fed to a digital computer is also affected because the word length for accurate digitization is restricted by the large dynamic range of the signal.

The present invention addresses the problems associated with the reception and analysis of a series of signals that are produced by NMR testing of samples in substances such as water or the like and that consequently have a large dynamic range. For example, NMR is a diagnostic technique widely used for medical diagnosis. In NMR, a test object is first subjected to a biasing magnetic field to align previously randomly oriented magnetic dipoles present in the nuclei. Other nuclei could be selected as the objects of interest, but protons are ordinarily the most useful to study in medically related investigations. The test object is then subjected to a pulse of a second magnetic field at a frequency calculated to increase the energy of selected nuclei by coupling to a characteristic resonant frequency of the nuclei. When the second magnetic field is turned off, the return of the nuclei to the first alignment releases energy which is detected, analyzed, and processed to form either a spectrum or a plot of free-induction decay. From the spectrum or plot of free-induction decay, the presence of particular molecular bonds can be observed and correlated with characteristic spectra for various molecules or materials. The concentration of that molecule or material can then be determined.

NMR systems have been used to analyze blood and to develop spectra of proton resonances. In such spectra, identifiable peaks are obtained for substances such as water, glucose and ethanol. In reported tests, blood serum has been taken from animals, placed in a container and excited to yield the proton spectra, which are then analyzed.

Existing NMR equipment, especially that used for medical Purposes, is generally large, complicated and expensive, and is therefore available only at hospitals, universities, and other similar research and test sites. The equipment therefore is not normally used for blood or body fluid analysis, as more convenient and less expensive alternatives are available, such as the invasive techniques described above.

The present invention applies a true logarithmic (log) amplifier to an NMR receiver to compress a received signal. This improves the dynamic range of the system and allows it to detect, identify and quantify both small and large concentrations of selected constituents simultaneously present in samples more accurately than before. A true log amplifier is defined here as an amplifier in which the output signal is proportional to the logarithm of the input signal and in which the input and output frequencies are the same, thus preserving information about the zero crossings of the signals. In contrast, some log amplifiers include envelope detection in processing the input signal, thus losing phase information which is important in NMR analysis.

Use of a log amplifier in signal processing systems is well known. In a series of patents assigned to Schlumberger Technology Corporation, New York, New York, the use of a log amplifier in a system to analyze and process electromagnetic signals is described. U.S. Pat. Nos. 4,063,151 (Suau et al.), 4,077,003 (Rau), 4,151,457 (Rau), 4,156,177 (Coates) and 4,338,567 (Coates) all teach various ways to use electromagnetic energy to determine the amount of bound and free water surrounding a bore hole so as to establish the porosity of the rock surrounding the bore hole. While a log amplifier is described as part of the operating hardware used to detect and analyze signals, no use is made of the log amplifier to improve the dynamic range or to compress the amplitude of the instantaneous signal.

In Russian Patent No. 873,187 (Yof et al.) the use of nuclear magnetic resonance to explore bore holes includes a log amplifier to process and analyze electromagnetic signals transmitted at the bore hole. This reference does not teach real-time signal compression or increasing the dynamic range of the received signal.

In U.S. Pat. No. 4,255,968 (Harpster) a flow indicator is taught in which a log amplifier is used to process a signal derived from the differences in readings of upstream and downstream temperature sensors. This produces a signal that is Proportional to the logarithm of the flow rate. This reference does not teach the use of the log amplifier to compress an incoming signal while preserving the phase information carried by that signal.

In using NMR spectroscopy for the purpose of analyzing body fluids for the presence of selected constituents, it is important that all phase information generated by the reflected NMR signal be preserved for analysis, because it is the phase shifts recorded in the signals that will indicate the presence of a selected constituent. This is true in general in any NMR analysis in which a solvent or other carrier is present in such relatively large concentrations as to swamp the NMR signal from a solute or other desired substance when the NMR signal is sent through a linear amplifier. An amplifier circuit used to detect and process these signals must include provision for preventing early saturation of the amplifier by the incoming signal. Such saturation will mean that during a portion of the signal its amplitude cannot be measured. This is important because quantification of the constituents present is based upon the ability of the system to compare the amplitudes of the signals for the water component of the body system with the amplitudes of the characteristic constituent signal for the body sample being tested and for a standard sample to which it is compared. All of these data must be stored in real time without distortion for later signal analysis. By compressing the dynamic range, the true log amplifier avoids saturation by the stronger signals (in particular, the water signal) while enabling the system to detect and preserve the amplitudes and phases of the other signals characteristic of the selected constituents.

SUMMARY OF THE INVENTION

In a system for analysis using nuclear magnetic resonance, a true log amplifier is used to compress a signal having a large dynamic range. The true log amplifier has an output voltage proportional to the log of the input signal originating from the receiving circuitry of a nuclear magnetic resonance device to scale the resulting large dynamic range of the signal for accurate and efficient compression for digitization by conventional analog-to-digital conversion techniques while preserving phase information. The resulting digitized data are then processed by a digital computer. A series of identical true log amplifiers applied in stages affords an increase in small-signal gain and a lower gain at the higher signal level of the range. Staging the true log amplifiers compresses the dynamic range of the resulting nuclear magnetic resonance signal for analysis with minimum distortion while preserving phase information in the signal. The true log amplifier may be included as an integral part of a system for NMR analysis or NMI (nuclear magnetic imaging) or it may be used as a separate component suitable for processing signals in existing NMR or NMI systems.

Many other advantages and features of the invention will become apparent from the following detailed description of a Preferred embodiment of the invention, from the claims, and from the accompanying drawings, in which like numerals are employed throughout to designate like parts.

BRIEF DESCRIPTION OF THE DRAWINGS

FIG. 1 is a vertical cross-sectional view of an NMR spectroscopic instrument for the practice of the present invention;

FIG. 2 is a vertical cross-sectional view taken along line 2—2 of FIG. 1;

FIG. 3 is a block diagram of the circuitry used to operate the instrument of FIG. 1;

DETAILED DESCRIPTION OF THE INVENTION

Figure 4A:
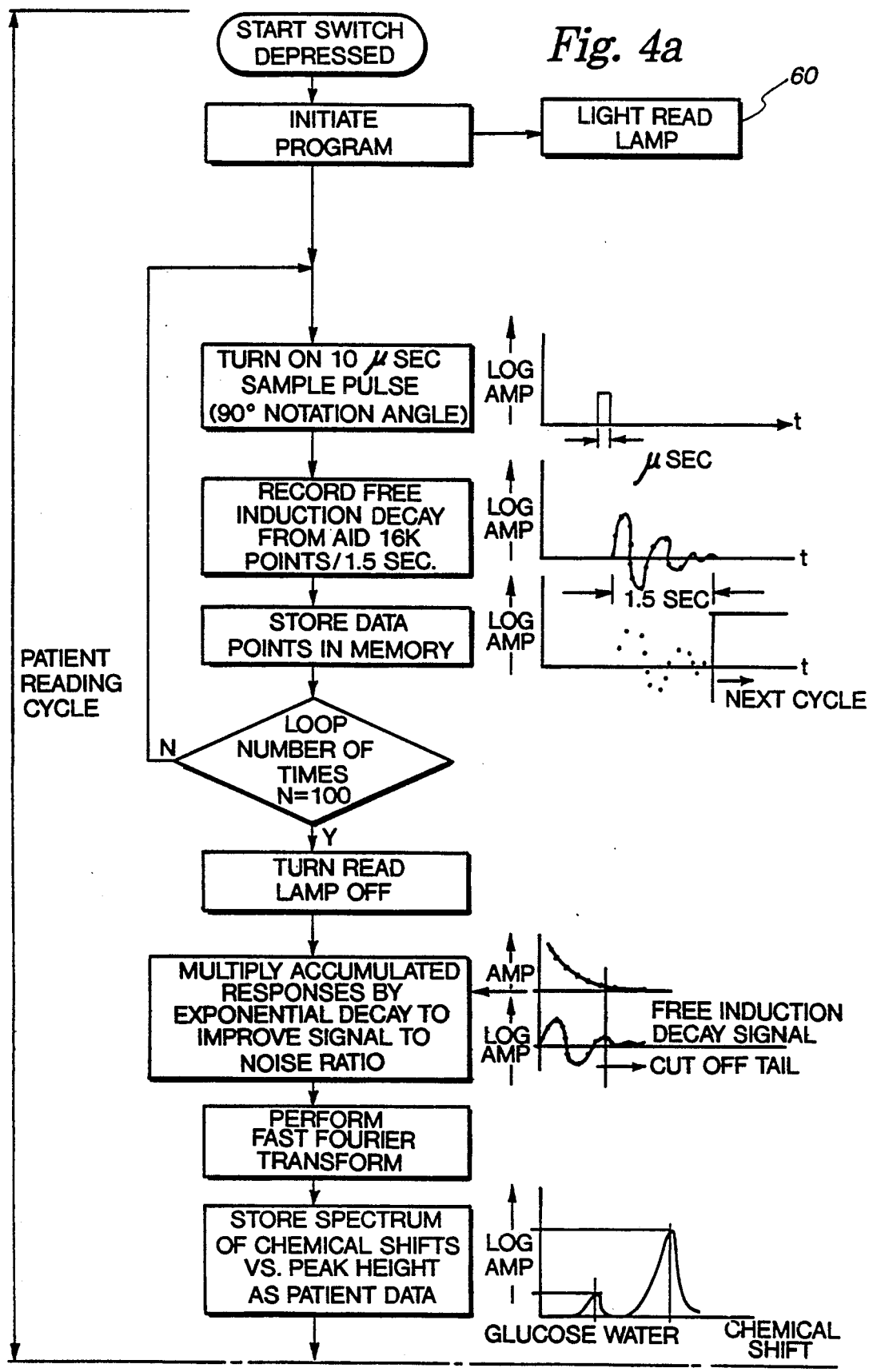
FIGS. 4A, 4B and 4C are flow charts showing the operation of the instrument.

FIGS. 1 and 2 show an NMR instrument 10 including a recess 12 for receiving an extremity of a patient, such as a finger, and exposing the extremity to a first or biasing magnetic field and also a second magnetic field that can be pulsed. The recess 12 may also receive a test tube or other sample holder containing a test sample that may comprise organic or inorganic matter that is solid (crystalline or amorphous), liquid, gaseous, or any combination of these. A sensor 38 is provided to detect the rates of relaxation or energy release to develop characteristic spectra for selected constituents or to develop free-induction decay characteristics associated with the constituents. Analytical means 40 are coupled to the sensor for receiving and analyzing the signals emitted, discriminating among various constituent peaks, comparing the amplitudes or heights of various peaks, such as water, glucose or the like, and normalizing the analysis by reference to a standard sample to obtain the concentration of constituents in the tested materials.

One of the principal components of the NMR instrument 10 is the biasing magnet 22 that provides the first magnetic field. In this device the biasing magnet 22 is much smaller than the magnets used in standard NMR machines. For example, the biasing magnet 22 may weigh between eight and sixty pounds in contrast to magnets typically used in hospital NMR installations that weigh thousands of pounds. A coil 38 applies a second magnetic field to the test sample and senses the energy released from the sample when the second field is reduced to zero. The coil 38 may be single or multiple. The electronic circuit used for the analysis includes a true log amplifier to process signals received from the coil 38 and send the processed signals to a microprocessor that is programmed to control the application of the second field or energy source and to detect and analyze the spectra received from the sample when the field is relaxed. Operation of the microprocessor and the means for producing and transmitting signals to the microprocessor are disclosed here.

A holder 30 to hold a standard sample is shown positioned in the recess 12. The apparatus includes a compression biasing spring 32 pressing at one end against the back wall 24 and against the holder 30 at the other end. The holder 30 is mounted on a post 35 which is guided through an aperture 37. A start switch 36 is mounted to the back wall offset from the post 35 so that when the holder 30 is pushed against the spring 32 toward the back wall 24, the holder 30 will depress the start switch 36 to start operation of the instrument. Release of the holder 30 will release the switch 36. The switch 36 may also be mounted outside, such as beneath the head 39 of the post 35, and may be operated upon movement of the head 39.

A surface coil 38 is mounted in the housing adjacent to one of the permanent magnets 26 and 28. The coil 38 produces the second field and acts as a source of magnetic flux for realignment and for sensing purPoses. As seen in FIG. 1, the second field produced by the surface coil 38 is transverse to the first or permanent magnet field. The surface coil 38 has been selected for this embodiment because the depth of magnetization (i.e., extent of penetration of the field) is related to the diameter of the coil 38 and can thus be controlled.

The surface coil 38 may be a single coil for both energizing and sensing. The coil 38 can also be an assembly of multiple coils, each of which can be used for energizing, sensing or both. Furthermore, the coil 38 may be an assembly of two or more coils, where at least one is for energizing and at least one other coil is for sensing.

The housing 25A and 25B for the electronics is provided with an electronic interlock system 56 (shown schematically in FIG. 3) so that removal of the cover will disable the electronics, thereby preventing unauthorized tampering with or repair of the device which could destroy calibration and result in incorrect results.

A test is run on a human subject by having the subject insert his or her finger into the instrument, pushing the sample holder toward the back wall 24 and into engagement with the start switch 36 to start the analysis as described below. It will be noted that the finger is positioned so that the fingernail is located adjacent to the surface coil 38. This positioning is chosen as the fingernail, though dead tissue, has a bed of active blood vessels located just below the nail. These blood vessels are believed to provide an appropriate testing site. In many other test sites, live body tissue or bone must be penetrated in order to test blood vessels, which means that the tissue or bone will emit signals which act as noise and may interfere with analysis of the blood for the concentration of its constituents. The finger region is preferable because the nail is essentially dead material that produces little or no interfering noise, thereby increasing the signal-to-noise ratio. Other body extremities can be tested, such as, for example, the ears of humans or other animals.

The testing circuit 40 of FIG. 3 includes a battery power supply 42. In a permanent installation, such as the office of a physician, a hospital, or the like, a commercial AC power supply and battery charger may be used to supply energy to the battery or the circuit may be powered directly from the AC line.

Depressing the start switch 36 activates the circuit, which includes a microprocessor 44. The microprocessor 44 activates an RF generator and cyclically-operated gate 46, which excites the surface coil 38 to apply the second field, raising the energy state to realign the selected nuclei.

At an appropriate time and under control of the microprocessor 44, the RF generator is turned off, thereby permitting dipoles in the nuclei to relax to their original alignments. The surface coil 38 then detects the energy released during relaxation and realignment of the dipoles. Those signals are received by log amplifier circuit 48, processed in a manner to be described below converted from analog signals to digital signals by the A/D converter 50 and fed to the microprocessor 44. A read-only memory (ROM) 52 is provided to store a program for use with the microprocessor 44 in calibrating the machine and analyzing and displaying test results. If separate coils are used, one or more to excite the protons and another or others to detect signals from the relaxation, then the circuit is changed so that the RF generator is connected to the energizing coil and the log amplifier circuit 48 is connected to the sensing coil.

The ROM 52 is energized continuously by the battery 54. A cover interlock switch 56 is provided between the ROM 52 and the battery 54 to de-energize the ROM 52 if the cover 25A or 25B is opened, removed or tampered with. In such an event, the switch 56 is opened and the program in the ROM 52 is altered or erased. In the alternative, the ROM 52 may be an electrically erasable or alterable ROM. The ROM-cover interlock arrangement may be operated to generate an error message on the panel display, or it may be operated to disable the apparatus. Various other forms of electronic interlocks that are well known in the computer art may also be used.

Figure 4B:
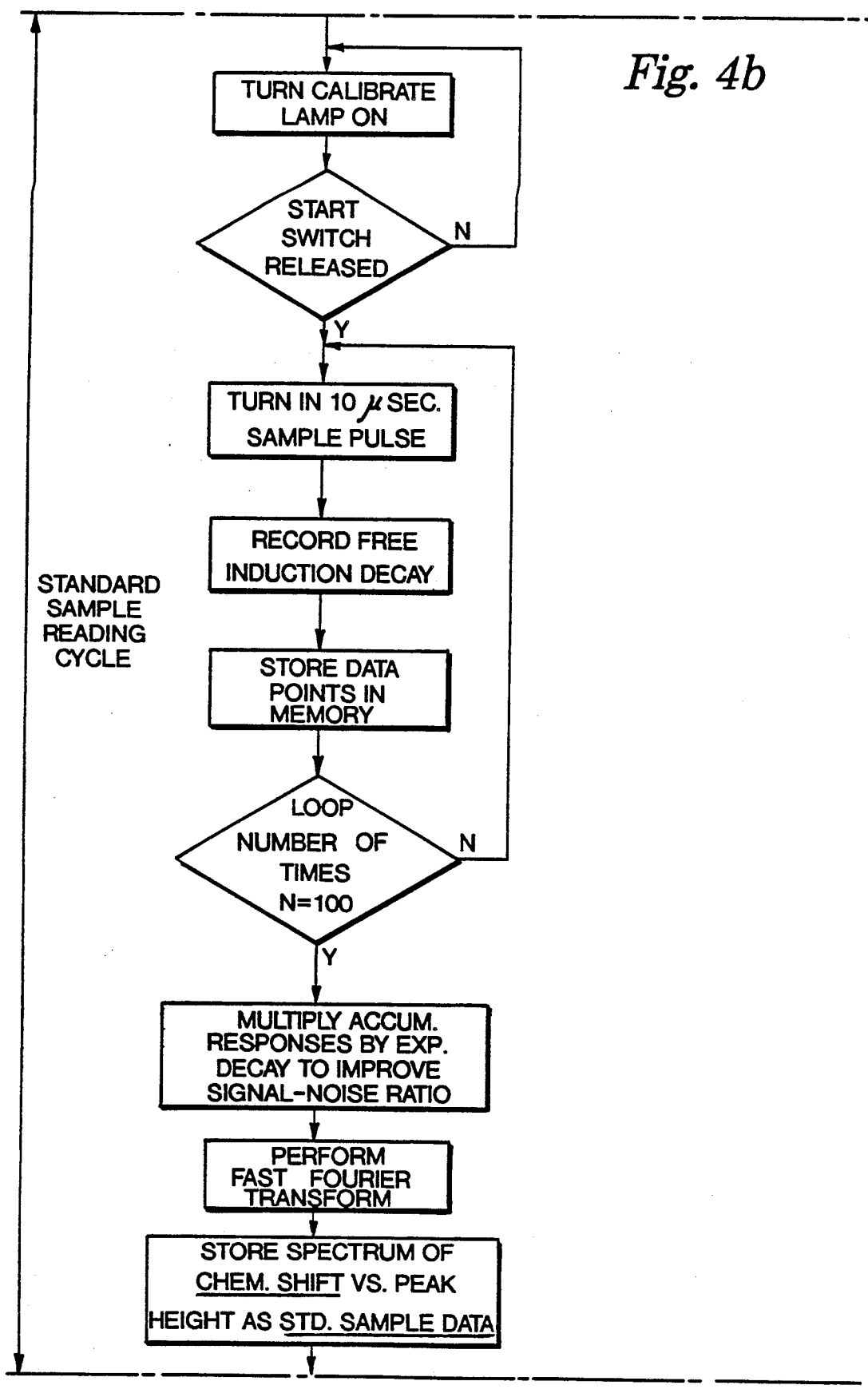
Figure 4C:
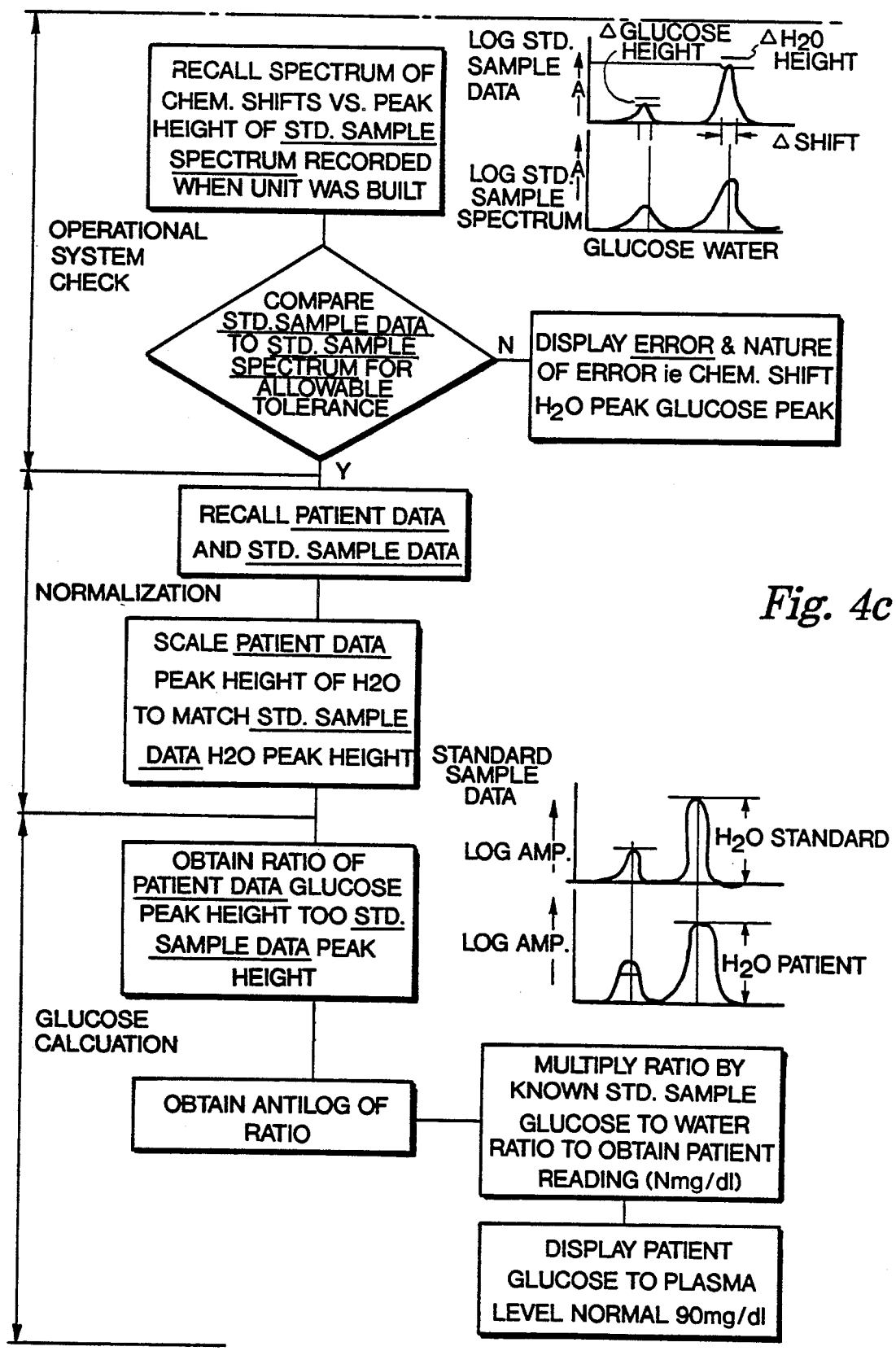

The testing circuit 40 also includes a display 58, preferably digital, which is connected to the microprocessor 44, and a group of status lamps (read 60, calibrate 62, display 64 and error 66), which indicate the operational status of the system. The ROM 52 includes a program as represented by the flow chart of FIGS. 4A-4C to control operation of the tester. FIGS. 4A through 4C show the various phases of the microprocessor 44 and ROM 46. These phases are as follows:
1. Subject reading cycle.
2. Standard-sample reading cycle.
3. Check of Operational system.
4. Calculation of normalized subject data and standard sample for equal water peak.
5. Calculation of constituent level.

Use of the present invention to detect and quantify blood glucose levels is performed as follows. Referring first to FIG. 4A, the test begins by depressing the starting switch 36, initiating the program and activating the READ light 60. A ten-microsecond sample pulse is taken, and the free-induction decay output from the A/D converter is noted. Next, the data points are stored in the memory 45 and the process is repeated or looped on the order of one hundred times. The right-hand column shows a series of diagrams representing the ten-microsecond sampling pulse, the decay, and a Fourier transform of the decay data points. The log-compressed amplitude of the response is recorded along the Y axis. After the samplings, the READ lamp 60 is deactivated, the accumulated responses are multiplied by an exponential decay to improve the signal-to noise ratio, a Fourier transformation is applied, and a spectrum of the chemical shifts versus the log of the peak height is stored as subject data.

FIG. 4B shows the reading cycle for the standard sample. Here the CALIBRATE light 62 is turned on, and the start switch is released. Once the switch is released, a ten-microsecond sampling pulse is taken, the log-compressed free-induction decay is recorded, and the data points are stored in the memory 45. The cycle is then repeated one hundred times or more. As in the subject reading cycle, the accumulated responses are multiplied by an exponential decay to improve the signal-to-noise ratio, Fourier transforms are run, and the spectrum of chemical shifts versus the log of peak height is stored as sample data.

The standard sample contains predetermined amounts of the constituent material or materials being tested for and acts as a reference level. In order to assure that there has been no significant change in the sample value or values, an operational check is applied by recalling the spectrum of chemical shifts versus the log of peak height data for the standard sample and comparing it to the standard data previously taken to see if they are within allowable tolerances. If the error is not within an acceptable tolerance, the ERROR display lamp 66 is lit to notify the operator. If the data are within an allowable error, the system proceeds to the next step. FIG. 4C shows a comparison between data from the standard sample and a standard sample spectrum showing the allowable shifts, compressed peak height and frequency with log amplitude plotted along the Y axis.

The next step is to normalize the subject data and standard data for equal water heights. Here the subject data are recalled and the standard data are recalled. Next, the peak height of the subject water data is scaled to match the peak height of the standard water data.

The system then executes the next step which is to calculate the glucose level. Normal glucose concentration in human blood is about ninety milligrams per deciliter. A ratio is obtained of the peak height of the subject data and the peak height of the standard sample data. The antilog of this ratio is obtained and then multiplied by the known ratio of glucose to water in the standard sample to obtain the subject reading. The ratio is then multiplied by a concentration factor (K) from the standard sample and expressed in milligrams per deciliter or some other convenient unit. The subject glucose level is then displayed in relation to plasma level.

This relationship is derived as follows:
1. The standard sample is prepared having a known glucose concentration expressed, for example, in milligrams of glucose per deciliter of water (mg/dl) and is referred to as K.
2. A subject is tested and the water and glucose peak heights are obtained.
3. The standard sample is then tested for water and glucose peak heights.
4. The water peak height of the subject is normalized by determining the ratio of water standard peak height/water subject peak height. This ratio is referred to as gain.
5. The glucose peak height of the subject is normalized by multiplying the subject glucose peak height by the gain. The result is the normalized subject glucose level. Expressed algebraically:

$$\text{Subject Glucose normalized} = \left( \frac{\text{Water standard}}{\text{Water subject}} \right) \times \text{Subject glucose concentration}$$

6. In order to obtain the actual subject glucose concentration, expressed in units such as mg/dl, the antilog of the ratio of the subject normalized glucose to glucose standard is multiplied by the concentration factor K. In other words:

$$\text{Subject glucose concentration} = \log^{-1} \left( \frac{\text{Subject Glucose normalized}}{\text{Glucose standard}} \right) \times K$$

In other words, the Subject glucose concentration is equal to:

$$K \times \text{the antilog of the ratio of the normalized subject glucose to the glucose standard.}$$

7. The entire expression which combines the steps of numbers 1–6 above can be stated as:

$$\text{Subject glucose concentration} \left( \frac{mg}{dl} \right) = K \left( \frac{mg}{dl} \right) \times$$

$$\text{antilog} \left\{ \frac{\left( \text{Glucose subject peak height} \right)}{\left( \text{Glucose standard peak height} \right)} \right\} \times \left( \frac{\text{Water standard peak height}}{\text{Water subject peak height}} \right)$$

Figure 5A:
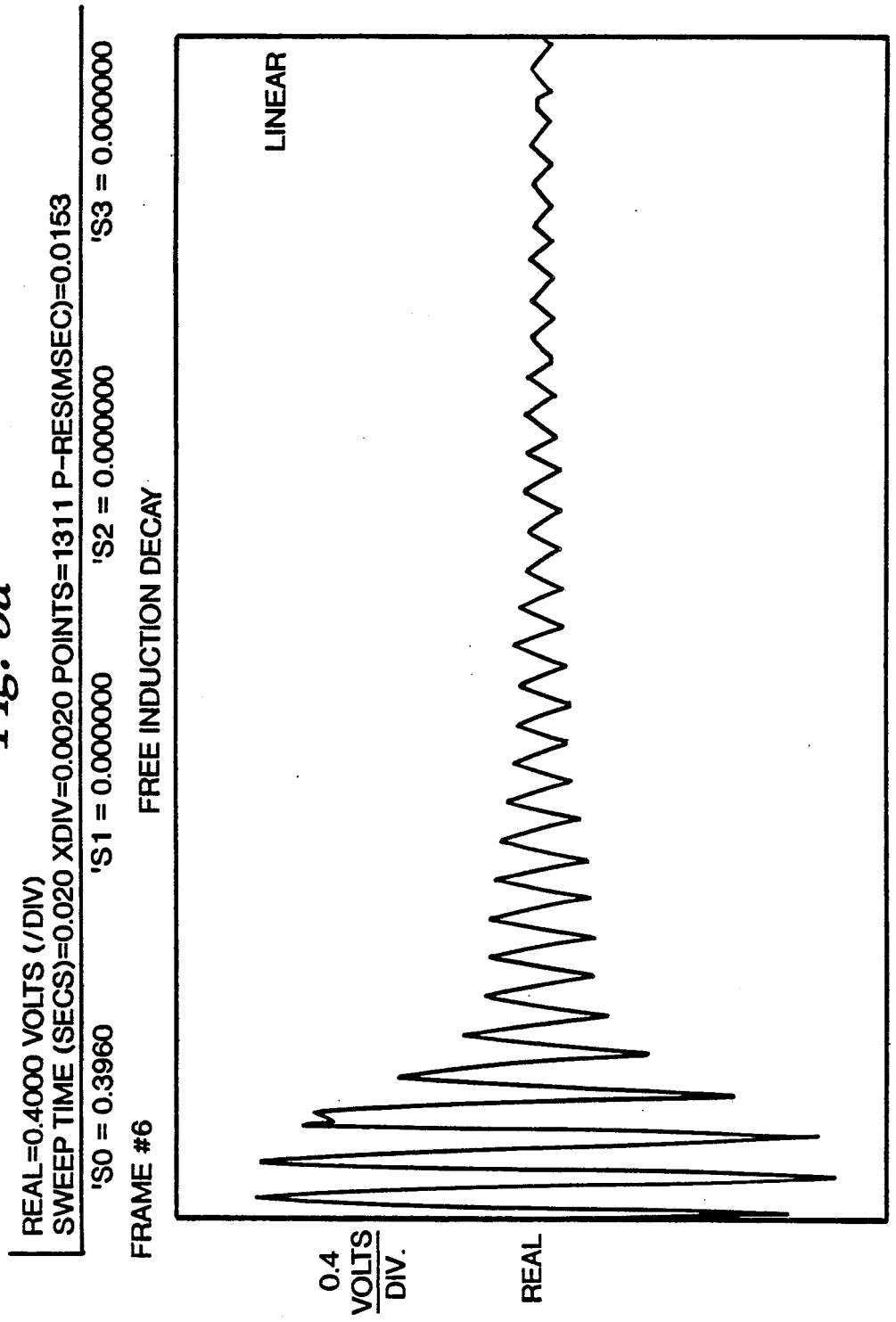
FIG. 5A is a time plot showing the free-induction decay obtained by NMR from a water sample using a linear amplifier.
Figure 5B:
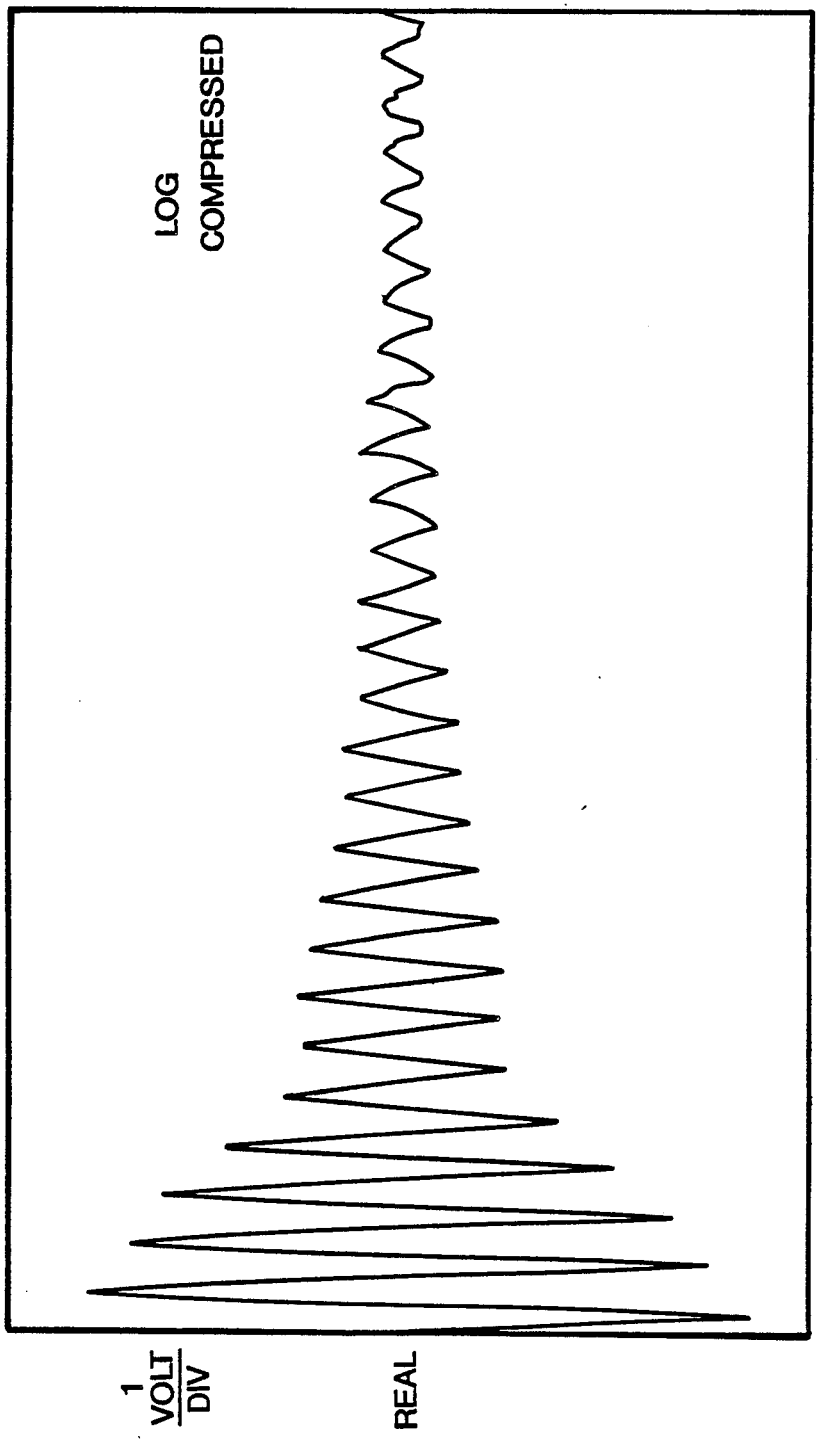
FIG. 5B is a time plot showing the free-induction decay obtained by NMR from the same water sample under identical conditions using a true log amplifier.

FIG. 5A is a time plot of the free-induction decay obtained from NMR on a water sample using a linear amplifier and FIG. 5B is a time plot of the free-induction decay obtained for the same sample using a true log amplifier. The two time plots are normalized to the same initial amplitudes. A comparison of FIG. 5A with FIG. 5B shows that fine structure is significantly larger in FIG. 5B, the one obtained with the true log amplifier. This is true largely because the true log amplifier does not saturate over a range in which the linear amplifier will have saturated. This makes it possible to set the gain at an appropriate value to preserve fine structure. The use of the true log amplifier also makes it possible to start taking readings as soon as the driving energy applied to the coil 38 has been dissipated to free the coil 38 for use as a sensor, preserving valuable data that would otherwise be lost in saturation of the linear amplifier.

Figure 6:
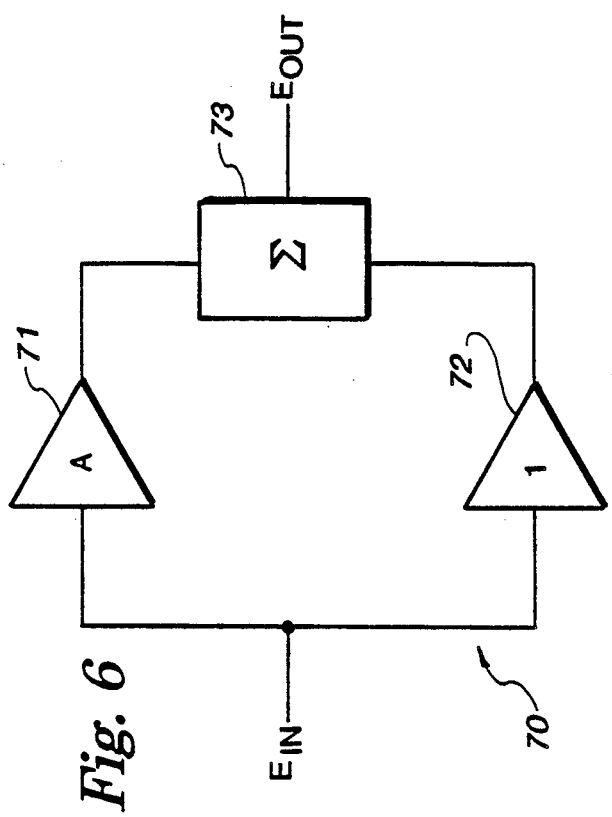
FIG. 6 is a schematic diagram of a true log amplifier as used in the practice of the present invention.

FIG. 6 is a schematic diagram of a single-stage true log amplifier. In FIG. 6, the numeral 70 indicates a basic log amplifier circuit having two analog amplifiers 71 and 72, connected in parallel, in which the amplifier 71 operates as a limiting amplifier and the amplifier 72 has unity gain. The outputs of the amplifiers 71 and 72 are taken to a summer 73, the output of which is $e_{out}$. The limiting amplifier 71 is designed to have a gain A for signals below the threshold input signal ($e_{in}$.) and to limit the signal above the threshold level with minimal distortion or phase shift. The combination in the summer 73 of the outputs of the limiting amplifier 71 and the unity-gain amplifier 72 provides an output for small signals below the threshold ($e_{in}'$) as $$e_{out} = (A+1)e_{in}$$

For signals above the threshold $e'$ in the output is described as $$e_{out} = e_L + e_{in}$$

where $e_L = A \times (e'_{in})$. At the threshold point, $e_o'$ can be evaluated by $$e_o' = (A+1)e_{in}' = e_{in}' + e_L,$$

so that $e_{in} = e_L/A$.

If several such amplifiers consisting of several identical stages are cascaded together conventionally such that $$e_o = [n + 1/A + \log_{(A+1)}[A\ e_{in}/eL]]e_L,$$

the result is a series of straight-line sections that have break points on a logarithmic curve.

Figure 7:
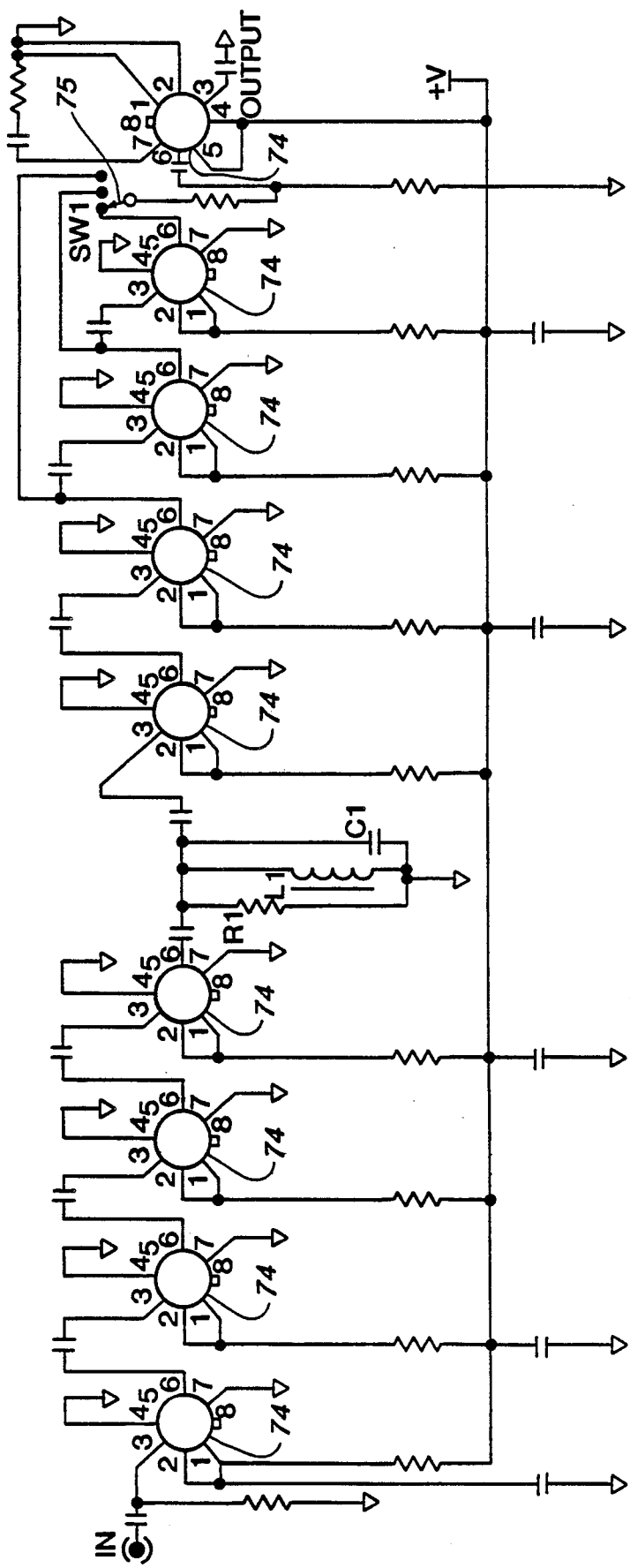
FIG. 7 is a schematic diagram of a series of cascaded true log amplifiers of the preferred embodiment of the present invention.

In FIG. 7, a series of cascaded true log amplifiers 74 is depicted using a 250 MHz true log IF amplifier on a semiconductor chip that is a SL531C manufactured by the Plessey Semiconductor Co. The frequency range and bandwidth are determined by the combination of resistance, capacitance and inductance in the circuit. With the use of the SL531 chip, the compression range is selectable from 80 dB to 60 dB by the switch 75. The various stages shown in FIG. 7 allow the desired degree of compression to be selected by the number N of stages. Achieving a desired dynamic range from the nuclear magnetic resonance received signal is determined by $$\text{dynamic range} = N \times [20\ \log_{10}(A+1)]$$

where N is the number of stages employed and A is the linear or small-signal gain per stage.

Figure 8:
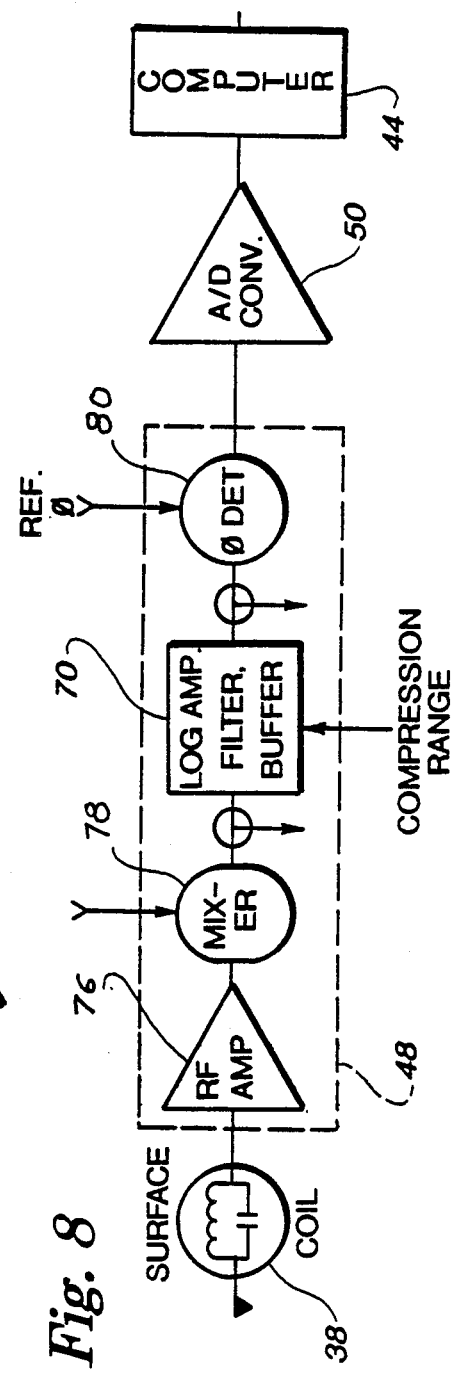
FIG. 8 is a diagrammatic representation of the cascaded true log amplifiers installed in a typical NMR receiver for magnetic resonance, used in the analysis of materials.

FIG. 8 shows a log amplifier circuit 48 connected to a surface coil 38. In FIG. 8, an RF amplifier 76 is connected to a mixer 78, then to a log amp 70 and a phase detector 80. Signals processed by the circuit 48 are fed through the A/D converter 50 to the microprocessor 44 for analysis as described above.

A true log amplifier such as the one shown here processes complicated multicomponent signals with minimum distortion, while preserving the phase information contained in the signals. A true log amplifier used with the nuclear magnetic resonance system described above allows a signal extending over a large dynamic range to be scaled by selecting N stages on the log strip and instantaneously compressing the total range to a fixed +20 dB range for the analog-to-digital coverter and computer to process. Instantaneous compression in the receiver results in high gain for small signals and low gain for large signals so that the signal processor can always operate over a selected, fixed range.

This characteristic finds particular utility in the present invention in view of the relatively small signal received from an organic substance in the blood as compared to the relatively large signal received from the major blood constituent, water. No discontinuities are generated by the circuit of the present invention and no baseline distortion is produced. A notch filter could still be employed ahead of the analog-to-digital converter to reduce a signal peak further if desired, or a notch can be created in the level of the exciting energy as is is done with a system using a conventional Redfield 214 pulse sequence. In fact, all existing techniques are still available to the spectroscopist practicing the present invention to use in selecting a transmitter pulse sequence and in software processing.

In an alternate embodiment of the present invention, a log amplifier may be added to existing Magnetic Resonance Imaging (MRI) systems to provide more useful and accurate processing of received NMR signals.

MRI systems are designed for spectroscopy, imaging, spectroscopy in an imaging machine, or 3-dimensional mapping of densities of substances, especially of water. They require a gradient magnetic field which can be adjusted to perform the mapping. The gradient can be switched off to provide a uniform homogeneous field over a small volume. If a pickup surface coil is employed to recover the signal from this localized area, chemical spectroscopy can be performed and the resulting signal can be processed in combination with a true log amplifier. The coupling of these two elements with either the existing analog-to-digital converter and computer or a separate signal processing unit allows localized chemical analysis to be performed on organs, fluids, metabolic rate, and the like in real time, non-invasively and on existing machines.

Wherever the use of a true log amplifier is described here to process NMR signals, it should be understood that such processing will be directed and supported by software selected to adjust, interpret and display the signals in enhanced and useful form.

While the foregoing description has presented specific embodiments of the present invention it is to be understood that these embodiments have been presented by way of example only. In particular, the disclosure has shown an embodiment that obtains better data from glucose in water. This is only one of many possible applications of the present invention, which is usable in NMR studies of any substances that exhibit nuclear magnetic resonances that can be detected and analyzed. It is expected that others will perceive differences which, while bearing from the foregoing, do not depart from the spirit and scope of the invention described and claimed here.

What is claimed is:

1. In an apparatus for testing a material for the presence of constituents using nuclear magnetic resonance analysis, the apparatus being of the type in which a first magnetic field aligns a magnetic dipole to a first position and in which a second magnetic field is cyclically energized to cause alignment of the magnetic dipole to a second position and then de-energized to allow the magnetic dipole to realign to the first position, and in which signals generated as a result of magnetic changes during realignment are detected and analyzed, the improvement comprising:
   a) first circuit means for detecting the signals, the first circuit means including means for compressing the dynamic range of the detected signals to produce compressed detected signals; and
   b) second circuit means for analyzing the compressed detected signals for the presence of information characteristic of at least one of the constituents.

2. The apparatus of claim 1 wherein the means for compressing comprises a true logarithmic amplifier.

3. The apparatus of claim 2 wherein the information comprises a spectrum.

4. The apparatus of claim 2 wherein the information comprises a time plot of free-induction decay.

5. In an apparatus for testing fluids for the presence of constituents using nuclear magnetic resonance analysis, the apparatus being of the type in which a first magnetic field aligns protons to a first position and in which a second magnetic field is cyclically energized to cause alignment of the protons to a second position and then de-energized to allow the protons to realign to the first position, and in which signals generated as a result of magnetic changes during realignment are detected and analyzed, the improvement comprising:
   a) first circuit means for detecting the signals, the first circuit means including means for compressing the dynamic range of the detected signals to produce compressed detected signals; and
   b) second circuit means for analyzing the compressed detected signals for the presence of information characteristic of at least one of the constituents.

6. The apparatus of claim 5 wherein the means for compressing the dynamic range comprise a true log amplifier.

7. The apparatus of claim 6 wherein the information comprises a spectrum.

8. The apparatus of claim 6 wherein the information comprises a time plot of free-induction decay.

9. An apparatus for performing nuclear magnetic resonance spectroscopy of a substance to test for the presence of certain constituents, the apparatus comprising:
   a) a housing;
   b) a permanent magnet disposed within the housing, the permanent magnet at least partially defining a test region within the housing, the permanent magnet creating a magnetic field that is effective to align to a first position protons in the substance located in the test region, the magnetic field of the permanent magnet being substantially uniform in field strength and direction throughout the test region;
   c) means for enabling access to the test region to insert a vessel containing a test sample of the substance to be tested;
   d) means for producing gated radio frequency pulses in the test region;
   e) means for exciting and sensing electrical signals positioned within the housing and in close proximity to the test region, the means for exciting and sensing connected to the means for producing gated radio frequency pulses and energized cyclically by the means for producing gated radio frequency pulses to flip the protons cyclically from the first position to a second aligned position, the means for exciting and sensing further sensing magnetic changes as analog data signals during realignment of the protons from the second position to the first position;
   f) means connected to the means for exciting and sensing for receiving the analog data signals during realignment of the protons to the first position;
   g) means for compressing dynamic range of the analog data signals and for converting the analog data signals into digital data signals, the means for compressing connected to the means for receiving the analog data signals;
   h) means for receiving the digital data signals, the means for receiving the digital data signals connected to the means for compressing; and
   i) means connected to the means for receiving for displaying the digital data signals to a user.

10. The apparatus of claim 9 wherein the means for compressing comprises a true logarithmic amplifier.

11. An apparatus for NMR analysis of a body fluid to detect the presence of a constituent, the apparatus comprising:
    a) a principal magnet partially defining a test region and having a pair of opposed magnetic poles establishing a substantially uniform magnetic field within the test region, the principal magnet positioned to receive and test the body fluid in a vessel and also in a body extremity, both of which are disposed between the poles and in the test region;
    b) a coil disposed in the test region; and
    c) a circuit coupled to the coil for producing an energizing field within the test region and for detecting changes resulting from relaxation of the aligned nuclei and for analyzing the changes, the circuit including means for energizing the coil at a resonant frequency of protons in the field and also including means for detecting signals produced as a result of the changes, the circuit further including means for compressing the dynamic range of the detected signals to enhance detectability of weaker ones of the signals in the presence of stronger ones of the signals.

12. The apparatus of claim 11 wherein the means for compressing comprises a true logarithmic amplifier.

13. In an apparatus for analysis using nuclear magnetic resonance in which a first magnetic field aligns protons to a first position and in which a second magnetic field is cyclically energized to cause realignment of the protons followed by their return to the first position, and in which signals generated as a result of magnetic changes during realignment are detected and analyzed by a processing circuit, the improvement comprising means responsive to the signals for compressing a dynamic range of the signals to prevent saturation of the processing circuit.

14. The apparatus of claim 13 wherein the means for compressing comprises a true logarithmic amplifier.

15. A method for non-invasively determining in situ and in vivo the amount of a constituent in a body fluid using nuclear magnetic sPectroscopy, the method comprising the steps of:

a) applying a biasing magnetic field to a test sample of the body fluid containing the constituent to align protons in the test sample in a first orientation;

b) applying a resonating field to move the protons from the first orientation to a second orientation;

c) terminating the resonating field to allow the protons to return to the first orientation;

d) detecting magnetic changes produced as the protons return to the first orientation;

e) converting the detected changes to analog signals having a given dynamic range;

f) amplifying the analog signals while compressing the given dynamic range of the analog signals to produce compressed analog signals;

g) converting the compressed analog signals into digital signals;

h) storing the digital signals as test sample data in a memory;

i) multiplying the test sample data in the memory by an exponential decay to produce a multiplied test sample data with improved signal-to-noise ratio;

k) transforming the multiplied test sample data with a fast Fourier transform to obtain a spectrum of chemical shifts for the test sample of body fluid;

l) repeating the above steps for a standard sample which includes water and a predetermined amount of the constituent being tested for to produce a spectrum of chemical shifts for the standard sample;

m) comparing the spectrum of chemical shifts versus peak height of the standard sample with stored data of a previous predetermined spectrum of the standard sample for allowable error;

n) scaling the test sample data peak height of water to match the peak height of water in the standard sample data;

o) forming a ratio of the test sample constituent peak height to the standard sample constituent peak height;

p) obtaining an antilog of the ratio;

q) multiplying the ratio by the known standard sample ratio of constituent to water to obtain a test sample constituent reading in designated units that is the subject constituent level; and r) displaying the subject constituent level in the designated units.

16. In a method of analysis using nuclear magnetic resonance in which a first magnetic field aligns protons to a first position and in which a second magnetic field is cyclically energized to cause realignment of the protons followed by their return to the first position, and in which signals generated as a result of magnetic changes during realignment are detected and analyzed by a processing circuit, the improvement comprising compressing a dynamic range of the signals to prevent saturation of the processing circuit.

* * * * *